(12) United States Patent
Dershem

(10) Patent No.: US 7,795,362 B2
(45) Date of Patent: Sep. 14, 2010

(54) OLEFIN OLIGOMERS CONTAINING PENDANT MALEIMIDE GROUPS

(75) Inventor: Stephen M. Dershem, San Diego, CA (US)

(73) Assignee: Designer Molecules, Inc., San Diego, CA (US)

( * ) Notice: Subject to any disclaimer, the term of this patent is extended or adjusted under 35 U.S.C. 154(b) by 557 days.

(21) Appl. No.: 11/184,305

(22) Filed: Jul. 18, 2005

(65) Prior Publication Data

US 2006/0142517 A1 Jun. 29, 2006

Related U.S. Application Data

(60) Provisional application No. 60/588,604, filed on Jul. 16, 2004.

(51) Int. Cl.
*C08F 36/00* (2006.01)
*C08K 3/02* (2006.01)

(52) U.S. Cl. .......................... 526/283; 524/80
(58) Field of Classification Search ................. 526/283; 524/80
See application file for complete search history.

(56) References Cited

U.S. PATENT DOCUMENTS

| | | | |
|---|---|---|---|
| 3,905,820 A * | 9/1975 | Frass | 430/271.1 |
| 4,224,216 A * | 9/1980 | Locatelli et al. | 524/528 |
| 4,894,281 A * | 1/1990 | Yagi et al. | 442/62 |
| 4,968,738 A | 11/1990 | Dershem | |
| 5,045,127 A | 9/1991 | Dershem et al. | |
| 5,064,480 A | 11/1991 | Dershem et al. | |
| 5,232,962 A | 8/1993 | Dershem et al. | |
| 5,266,610 A * | 11/1993 | Malhotra et al. | 523/201 |
| 5,306,333 A | 4/1994 | Dershem | |
| 5,358,992 A | 10/1994 | Dershem et al. | |
| 5,403,389 A | 4/1995 | Dershem | |
| 5,447,988 A | 9/1995 | Dershem et al. | |
| 5,489,641 A | 2/1996 | Dersehm | |
| 5,646,241 A | 7/1997 | Dersehm et al. | |
| 5,714,086 A | 2/1998 | Osuna et al. | |
| 5,717,034 A | 2/1998 | Dershem et al. | |
| 5,718,941 A | 2/1998 | Dershem et al. | |
| 5,753,748 A | 5/1998 | Dershem et al. | |
| 5,861,111 A | 1/1999 | Dershem | |
| 5,969,036 A | 10/1999 | Dershem | |
| 5,973,166 A | 10/1999 | Mizori et al. | |
| 6,034,194 A | 3/2000 | Dershem | |
| 6,034,195 A | 3/2000 | Dershem | |
| 6,087,447 A * | 7/2000 | Stevens et al. | 525/211 |
| 6,121,358 A | 9/2000 | Dershem et al. | |
| 6,187,886 B1 | 2/2001 | Husson, Jr. et al. | |
| 6,211,320 B1 | 4/2001 | Dershem et al. | |
| 6,423,780 B1 | 7/2002 | Dershem et al. | |
| 6,429,281 B1 | 8/2002 | Dershem et al. | |
| 6,437,080 B1 * | 8/2002 | McGrail et al. | 528/171 |
| 6,521,731 B2 | 2/2003 | Dershem et al. | |
| 6,620,946 B2 | 9/2003 | Dershem et al. | |
| 6,743,852 B2 | 6/2004 | Dershem et al. | |
| 6,750,301 B1 | 6/2004 | Bonneau et al. | |
| 6,790,597 B2 | 9/2004 | Dershem | |
| 6,825,245 B2 | 11/2004 | Dershem | |
| 6,831,132 B2 | 12/2004 | Liu et al. | |
| 6,852,814 B2 | 2/2005 | Dershem | |
| 6,916,856 B2 | 7/2005 | Dershem | |
| 6,946,523 B2 | 9/2005 | Dershem et al. | |
| 6,960,636 B2 | 11/2005 | Dershem et al. | |
| 6,963,001 B2 | 11/2005 | Dershem et al. | |
| 7,102,015 B2 | 9/2006 | Dershem et al. | |
| 7,157,587 B2 | 1/2007 | Mizoir et al. | |
| 7,176,044 B2 | 2/2007 | Forray et al. | |
| 7,199,249 B2 | 4/2007 | Liu et al. | |
| 7,208,566 B2 | 4/2007 | Mizori et al. | |
| 7,285,613 B2 | 10/2007 | Dershem et al. | |
| 7,309,724 B2 | 12/2007 | Dershem et al. | |
| 7,517,925 B2 | 4/2009 | Dershem et al. | |
| 2002/0062923 A1 | 5/2002 | Forray | |
| 2002/0099168 A1 | 7/2002 | Dershem et al. | |
| 2002/0188137 A1 | 12/2002 | Dershem et al. | |
| 2002/0193541 A1 | 12/2002 | Dershem et al. | |
| 2002/0198356 A1 | 12/2002 | Dershem et al. | |
| 2003/0008992 A1 | 1/2003 | Dershem et al. | |
| 2003/0055121 A1 | 3/2003 | Dershem et al. | |
| 2003/0060531 A1 | 3/2003 | Dershem et al. | |
| 2003/0087999 A1 | 5/2003 | Dershem et al. | |
| 2003/0109666 A1 | 6/2003 | Dershem et al. | |
| 2003/0125551 A1 | 7/2003 | Dershem et al. | |
| 2003/0166746 A1 * | 9/2003 | Zhou et al. | 523/400 |
| 2003/0199638 A1 | 10/2003 | Liu et al. | |
| 2003/0208016 A1 | 11/2003 | Dershem et al. | |
| 2004/0006166 A1 | 1/2004 | Liu et al. | |
| 2004/0019224 A1 | 1/2004 | Dershem et al. | |
| 2004/0077798 A1 | 4/2004 | Dershem et al. | |
| 2004/0082724 A1 | 4/2004 | Dershem et al. | |
| 2004/0102566 A1 | 5/2004 | Forray et al. | |

(Continued)

*Primary Examiner*—William K Cheung
(74) *Attorney, Agent, or Firm*—The Law Office of Jane K. Babin, Professional Corporation; Jane K. Babin

(57) ABSTRACT

The invention is based on the discovery that certain crosslinkable functional groups can be incorporated into olefin oligomers, thereby making these functionalized olefin oligomers useful as thermosetting resin compositions. In particular, there are provided olefin oligomers containing pendant maleimide groups. These materials are readily prepared via cationic co-polymerization of cationically polymerizable olefin monomers and maleimide monomers containing a cationically polymerizable functional group.

43 Claims, No Drawings

U.S. PATENT DOCUMENTS

| | | |
|---|---|---|
| 2004/0123948 A1 | 7/2004 | Dershem et al. |
| 2004/0225026 A1 | 11/2004 | Mizori et al. |
| 2004/0225045 A1 | 11/2004 | Forray |
| 2004/0225059 A1 | 11/2004 | Mizori et al. |
| 2005/0107542 A1 | 5/2005 | Liu et al. |
| 2005/0136620 A1 | 6/2005 | Dershem et al. |
| 2005/0137277 A1 | 6/2005 | Dershem et al. |
| 2005/0267254 A1 | 12/2005 | Mizori et al. |
| 2005/0272888 A1 | 12/2005 | Dershem et al. |
| 2006/0009578 A1 | 1/2006 | Dershem |
| 2006/0069232 A1 | 3/2006 | Dershem |
| 2006/0142517 A1 | 6/2006 | Dershem |
| 2007/0155869 A1 | 7/2007 | Dershem et al. |
| 2007/0205399 A1 | 9/2007 | Mizori |
| 2007/0299154 A1 | 12/2007 | Dershem et al. |
| 2008/0017308 A1 | 1/2008 | Dershem |
| 2008/0075961 A1 | 3/2008 | Mizori |
| 2008/0075963 A1 | 3/2008 | Dershem |
| 2008/0075965 A1 | 3/2008 | Dershem |
| 2008/0103240 A1 | 5/2008 | Dershme |
| 2008/0142158 A1 | 6/2008 | Dershem |
| 2008/0146738 A1 | 6/2008 | Dershem |
| 2008/0160315 A1 | 7/2008 | Forray et al. |
| 2008/0191173 A1 | 8/2008 | Dershem et al. |
| 2008/0210375 A1 | 9/2008 | Dershem et al. |
| 2008/0251935 A1 | 10/2008 | Dersham |
| 2008/0257493 A1 | 10/2008 | Dershem |
| 2008/0262191 A1 | 10/2008 | Mizori |
| 2009/0061244 A1 | 3/2009 | Dershem |

* cited by examiner

OLEFIN OLIGOMERS CONTAINING PENDANT MALEIMIDE GROUPS

RELATED APPLICATIONS

This application claims the benefit of priority of U.S. Provisional Application Ser. No. 60/588,604 filed Jul. 16, 2004, the entire disclosure of which is incorporated herein by reference.

FIELD OF THE INVENTION

The present invention relates to oligomeric compositions, methods of preparation and uses therefor. In particular, the present invention relates to oligomeric compositions containing pendant maleimide groups.

BACKGROUND OF THE INVENTION

α-Olefin oligomers are widely used as a basis for synthetic lubricants of various applications (automotive, aviation, refrigerating, transformer, cable, cosmetic and other oils). They are also used as a stock for the production of additives and cutting fluids. These oligomers are commonly prepared by cationic oligomerization of $C_4$-$C_{14}$ α-olefins by Friedel-Crafts catalysis under isothermic conditions in low-output (1000 kg of oligomer per 1 m³ per hour) reactors.

α-Olefins, especially those containing about 6 to about 20 carbon atoms, are important items of commerce, with about 1.5 million tons reportedly being produced annually. The α-olefins are used as intermediates in the manufacture of detergents, as monomers (especially in linear low density polyethylene), and as intermediates for many other types of products.

Although α-olefins exhibit properties useful in certain industries, one way to expand the utility of these inexpensive and readily available materials is to incorporate functionality into the hydrocarbon framework of α-olefin oligomers. For example, introduction of crosslinkable moieties would allow these materials to be used in the adhesives industry as thermosetting resin compositions. In particular, the microelectronic packaging industry continually requires new materials to address the needs of that industry. Indeed, as the electronics industry advances, and production of light weight components increases, the development of new materials gives producers increased options for further improving the performance and ease of manufacture of such components.

Adhesive compositions, particularly conductive adhesives, are used for a variety of purposes in the fabrication and assembly of semiconductor packages and microelectronic devices. The more prominent uses include bonding of electronic elements such as integrated circuit chips to lead frames or other substrates, and bonding of circuit packages or assemblies to printed wire boards. Accordingly, there is a need for the development of materials to address the requirements of this rapidly evolving industry.

SUMMARY OF THE INVENTION

The invention is based on the discovery that certain crosslinkable functional groups can be incorporated into olefin oligomers, thereby making these functionalized olefin oligomers useful as thermosetting resin compositions. In particular, there are provided olefin oligomers containing pendant maleimide groups. These materials are readily prepared via cationic co-polymerization of cationically polymerizable olefin monomers and maleimide monomers containing a cationically polymerizable functional group.

In one embodiment of the invention, there are provided oligomers having the structure:

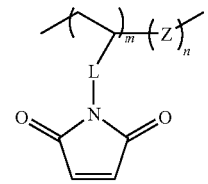

wherein:
Z is a cationically polymerizable monomer,
L is a direct bond or alkylene, oxyalkylene, arylene, or siloxane linker, and
m and n are each independently 3 to about 10,000.

In another embodiment, there are provided thermosetting resin compositions including at least one oligomer having the structure:

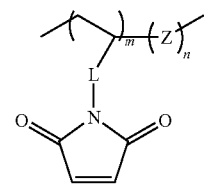

wherein:
Z is a cationically polymerizable monomer,
L is a direct bond or alkylene, oxyalkylene, arylene, or siloxane linker, and
m and n are each independently 3 to about 10,000; and
in the range of 0.2 up to 5 wt % of at least one curing catalyst, based on the total weight of the composition.

In another embodiment, there are provided assemblies including a first article permanently adhered to a second article by a cured aliquot of the thermosetting resin composition set forth above.

In still another embodiment, there are provided articles including a circuit board having a solder mask deposited thereon, wherein the solder mask is prepared from the thermosetting resin composition set forth above.

In another embodiment, there are provided articles including an electronic component encased within an aliquot of the thermosetting resin composition set forth above.

DETAILED DESCRIPTION OF THE INVENTION

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting.

The section headings used herein are for organizational purposes only and are not to be construed as limiting the subject matter described. Unless specific definitions are provided, the nomenclatures utilized in connection with, and the laboratory procedures and techniques of analytical chemistry, synthetic organic and inorganic chemistry described herein are those known in the art. Standard chemical symbols are used interchangeably with the full names represented by such symbols. Thus, for example, the terms "hydrogen" and "H" are understood to have identical meaning. Standard techniques may be used for chemical syntheses, chemical analyses, and formulation.

The invention is based on the discovery that certain crosslinkable functional groups can be incorporated into olefin oligomers, thereby making these functionalized olefin oligomers useful as thermosetting resin compositions. In particular, there are provided olefin oligomers containing pendant maleimide groups. These materials are readily prepared via cationic co-polymerization of cationically polymerizable olefin monomers and maleimide monomers containing a cationically polymerizable functional group.

In certain embodiments, there are provided oligomers having the structure:

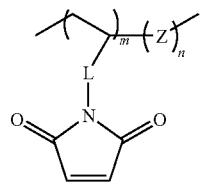

wherein:
Z is a cationically polymerizable monomer,
L is a direct bond or alkylene, oxyalkylene, arylene, or siloxane linker, and
m and n are each independently 3 to about 10,000.

As used herein, "alkylene" refers to a divalent alkyl moiety, and "oxyalkylene" refers to an alkylene moiety containing at least one oxygen atom instead of a methylene ($CH_2$) unit.

As used herein, "aryl" refers to divalent aromatic groups having in the range of 6 up to 14 carbon atoms.

A wide variety of cationically polymerizable monomers Z are contemplated for use in the practice of the invention. Such monomers include, for example, α-olefins, cyclic olefins, styrenes, epoxies, vinyl ethers, benzoxazines, and oxazolines, and the like. In some embodiments, the monomers include α-olefins (such as, for example, propylene, 1-butene, 1-pentene, 1-hexene, and the like). In other embodiments, the monomers include cyclic olefins (such as, for example, norbornene, norbornadiene, tetracyclododecene, dicyclopentadiene and other oligomers of cyclopentadiene, and the like). In other embodiments, the monomers include styrenes, such as, for example, 4-tert-butyl styrene, and the like.

Likewise, a wide variety of maleimides are contemplated for use in the practice of the invention. Indeed, any maleimide having a cationically polymerizable moiety attached to the maleimido nitrogen atom (either directly or through an alkylene, oxyalkylene, arylene, or siloxane linker L) can be used in the practice of the invention. As is well known to those skilled in the art, the maleimido unsaturation is resistant to cationic polymerization. Therefore, a maleimide monomer having a cationically polymerizable moiety attached to the maleimido nitrogen atom can undergo selective cationic polymerization, leaving the maleimido unsaturation available for subsequent, post-cationic polymerization crosslinking reactions.

The cationic polymerization typically results in oligomeric compounds rather, than high molecular weight species. Thus, in some embodiments, m and n are each independently from about 3 to about 10,000. In other embodiments, m and n are each independently from about 3 to about 5,000. In certain embodiments, m and n are from 3 to about 1,000. In still other embodiments, m and n are from 3 to about 100.

Catalysts typically used for the cationic polymerizations include, but are not limited to, a variety of Lewis acids such as for example, halides and alkyl halides of aluminum, boron, tin, and the like. In one embodiment, the catalyst is boron trifluoride etherate. The polymerization reaction is carried out in a suitable solvent such as, for example, toluene, at temperatures ranging from about −20° C. up to about 100° C. The oligomers produced by these types of catalysts can be random co-oligomers, alternating co-oligomers, or block co-oligomers, depending on the particular properties desired for a given application. In addition, the amount of maleimide co-monomer incorporated can also be tailored for a given specification.

In another embodiment of the invention, there are provided thermosetting resin compositions including: (a) at least one oligomer of the invention, and (b) in the range of 0.2 up to 5 wt % of at least one curing catalyst, based on the total weight of the composition. In some embodiments, the oligomers of the invention are present in the composition from 2 weight percent to about 98 weight percent (wt %) based on total weight of the composition. In other embodiments, there is at least additional compound that can co-cure with the maleimido-functionalized oligomer. The additional compound is typically present in the composition from 10 wt % to about 90 wt % based on total weight of the composition. Such additional compounds include, for example, epoxies (such as phenolics, novalacs (both phenolic and cresolic) and the like), imides, monomaleimides, bismaleimides, polymaleimides, cyanate esters, vinyl ethers, vinyl esters, vinyl acetates, esters, ureas, amides, olefins (such as ethylenes, propylenes, and the like) siloxanes, cyanoacrylates, styrenes, and the like, or combinations thereof.

The at least one curing initiator is typically present in the composition from 0.1 wt % to about 5 wt % based on total weight of the composition. In some embodiments, the curing initiator is a free-radical initiator. As used herein, the term "free radical initiator" refers to any chemical species which, upon exposure to sufficient energy (e.g., light, heat, or the like), decomposes into two parts which are uncharged, but which each possess at least one unpaired electron. Preferred free radical initiators contemplated for use in the practice of the present invention are compounds which decompose (i.e., have a half life in the range of about 10 hours) at temperatures in the range of about 70° C. up to 180° C. Exemplary free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methyl-propanenitrile), 2,2'-azobis(2-methylbutanenitrile), and 1,1'-azobis(cyclohexanecarbonitrile)), and the like.

The term "free radical initiator" also includes photoinitiators. For example, for invention adhesive compositions that contain a photoinitiator, the curing process can be initiated by UV radiation. In one embodiment, the photoinitiator is present at a concentration of 0.1 wt % to 5 wt % based on the total weight of the organic compounds in the composition (excluding any filler). In a one embodiment, the photoinitiator comprises 0.1 wt % to 3.0 wt %, based on the total weight of the organic compounds in the composition. Photoinitiators include benzoin derivatives, benzilketals, α,α-dialkoxyacetophenones, α-hydroxyalkylphenones, α-aminoalkylphenones, acylphosphine oxides, titanocene compounds, combinations of benzophenones and amines or Michler's ketone, and the like.

In a further embodiment, there are provided die-attach pastes including:
a) 2 weight percent to about 98 weight percent (wt %) of at least one maleimido-functionalized oligomer of the invention functionalized, based on total weight of the composition;
b) 0 to about 90 wt % of a filler;
c) 0.1 wt % to about 5 wt % of at least one curing initiator, based on total weight of the composition;
d) 0.1 wt % to about 4 wt %, of at least one coupling agent, based on total weight of the composition.

The die-attach pastes described herein may further contain additional compounds that can co-cure with the maleimido-functionalized oligomer. Such compounds include, for example, epoxies (such as phenolics, novalacs (both phenolic and cresolic) and the like), imides, monomaleimides, bismaleimides, polymaleimides, cyanate esters, vinyl ethers, vinyl esters, vinyl acetates, esters, ureas, amides, olefins (such as ethylenes, propylenes, and the like) siloxanes, cyanoacrylates, styrenes, and the like, or combinations thereof.

Fillers contemplated for use in the practice of the present invention can be electrically conductive and/or thermally conductive, and/or fillers which act primarily to modify the rheology of the resulting composition. Examples of suitable electrically conductive fillers which can be employed in the practice of the present invention include silver, nickel, copper, aluminum, palladium, gold, graphite, metal-coated graphite (e.g., nickel-coated graphite, copper-coated graphite, and the like), and the like. Examples of suitable thermally conductive fillers which can be employed in the practice of the present invention include graphite, aluminum nitride, silicon carbide, boron nitride, diamond dust, alumina, and the like. Compounds that act primarily to modify rheology include polsiloxanes (such as polydimethyl siloxanes) silica, fumed silica, alumina, titania, and the like.

As used herein, the term "coupling agent" refers to chemical species that are capable of bonding to a mineral surface and which also contain polymerizably reactive functional group(s) so as to enable interaction with the adhesive composition and/or die-attach paste. Coupling agents thus facilitate linkage of the die-attach paste to the substrate to which it is applied.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). In some embodiments, the coupling agents contain both a co-polymerizable function (e.g., vinyl moiety, acrylate moiety, methacrylate moiety, and the like), as well as a silicate ester function. The silicate ester portion of the coupling agent is capable of condensing with metal hydroxides present on the mineral surface of substrate, while the co-polymerizable function is capable of co-polymerizing with the other reactive components of invention die-attach paste. In certain embodiments coupling agents contemplated for use in the practice of the invention are oligomeric silicate coupling agents such as poly(methoxyvinylsiloxane).

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive composition.

In general, the adhesive compositions and/or die-attach pastes will cure within a temperature range of 80-220° C., and curing will be effected within a length of time of less than 1 minute to 60 minutes. As will be understood by those skilled in the art, the time and temperature curing profile for each adhesive composition will vary, and different compositions can be designed to provide the curing profile that will be suited to the particular industrial manufacturing process.

In certain embodiments, the adhesive compositions and/or die-attach pastes may contain compounds that lend additional flexibility and toughness to the resultant cured adhesive. Such compounds may be any thermoset or thermoplastic material having a Tg of 50° C. or less, and typically will be a polymeric material characterized by free rotation about the chemical bonds, the presence of ether groups, and the absence of ring structures. Suitable such modifiers include polyacrylates, poly(butadiene), polyTHF (polymerized tetrahydrofuran, also known as poly(1,4-butanediol)), CTBN (carboxy-terminated butadiene-acrylonitrile) rubber, and polypropylene glycol. When present, toughening compounds may be in an amount up to about 15 percent by weight of the maleimide and other monofunctional vinyl compound.

Inhibitors for free-radical cure may also be added to the adhesive compositions and die-attach pastes described herein to extend the useful shelf life of compositions containing the maleimido-functionalized oligomers described herein. Examples of these inhibitors include hindered phenols such as 2,6-di-tert-butyl-4-methylphenol; 2,6-di-tert-butyl-4-methoxyphenol; tert-butyl hydroquinone; tetrakis(methylene (3,5-di-tert-butyl-4-hydroxyhydrocinnamate))benzene; 2,2'-methylenebis (6-tert-butyl-p-cresol); and 1,3,5-trimethyl-2,4,6-tris(3',5'-di-tert-butyl-4-hydroxybenzyl)benzene. Other useful hydrogen-donating antioxidants include derivatives of p-phenylenediamine and diphenylamine. It is also well know in the art that hydrogen-donating antioxidants may be synergistically combined with quinones, and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis(3,5-di-tert-butyl-4-hydroxyhydrocinnamoyl)hydrazine; oxalyl bis(benzylidenehydrazide); and N-phenyl-N'-(4-toluenesulfonyl)-p-phenylenediamine.
Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

The adhesive compositions and die-attach pastes described herein will perform within the commercially acceptable range for die attach adhesives. Commerically acceptable values for die shear for the adhesives on a 80×80 mil$^2$ silicon die are in the range of greater than or equal to 1 kg at room temperature, and greater than or equal to 0.5 kg at 240° C. Acceptable values for warpage for a 500×500 mil$^2$ die are in the range of less than or equal to 70 Nm at room temperature.

In yet another embodiment of the invention, there are provided assemblies of components adhered together employing the above-described adhesive compositions and/or die attach pastes. Thus, for example, assemblies comprising a first article permanently adhered to a second article by a cured aliquot of the above-described adhesive composition are provided. Articles contemplated for assembly employing invention compositions include memory devices, ASIC devices, microprocessors, flash memory devices, and the like. Also contemplated are assemblies comprising a microelectronic device permanently adhered to a substrate by a cured aliquot of the above-described die attach paste. Microelectronic devices contemplated for use with invention die attach pastes include copper lead frames, Alloy 42 lead frames, silicon dice, gallium arsenide dice, germanium dice, and the like.

In other embodiments of the invention, there are provided methods for adhesively attaching a first article to a second article. Such methods can be performed, for example, by (a) applying an aliquot of an invention adhesive composition to the first article,
(b) bringing the first and second article into intimate contact to form an assembly wherein the first article and the second article are separated only by the adhesive composition applied in (a), and thereafter,
(c) subjecting the assembly to conditions suitable to cure the adhesive composition.

In still further embodiments, there are provided methods for adhesively attaching a semiconductor die to a substrate. Such methods can be performed, for example, by (a) applying an invention die attach paste to the substrate and/or the microelectronic device,
(b) bringing the substrate and the device into intimate contact to form an assembly wherein the substrate and the device are separated only by the die-attach paste applied in (a), and thereafter,
(c) subjecting the assembly to conditions suitable to cure the die attach paste.

Conditions suitable to cure invention die attach pastes include subjecting the above-described assembly to a temperature of less than about 200° C. for about 0.5 up to 2 minutes. This rapid, short duration heating can be accomplished in a variety of ways, e.g., with an in-line heated rail, a belt furnace, or the like. Optionally, the pastes can be oven cured at 150-220° C.

The following examples are intended only to illustrate the present invention and should in no way be construed as limiting the subject invention.

EXAMPLES

Example 1

Synthesis of a DCPD-Allyl Maleimide Co-Oligomer

To a reaction microvial was added allyl maleimide (0.68 g, 5 mmol), dicyclopentadiene (DCPD) (1.32 g, 10 mmol), toluene (2 mL), and finally 6 drops of $BF_3$-etherate. The reaction was allowed to proceed for 2 hours at 50-55° C. The mixture appeared yellow-brown had increased in viscosity. The toluene reaction solution was extracted with MeOH/H20 (80/20 v/v), and the toluene was removed by rotary evaporation to yield 0.4 g of an oily liquid. Infrared spectroscopy confirmed the presence of maleimide incorporation into the oligomer.

Example 2

Synthesis of a Styrene-Allyl Maleimide Co-Oligomer

To a reaction microvial was added allyl maleimide (0.137 g, 1 mmol), 4-tert-butyl styrene (1.32 g, 10 mmol), and toluene (2 mL). The reaction was then heated to between 65° C.

and 85° C. At this point, 10 drops of $BF_3$-etherate was added to the reaction solution. An immediate increase in viscosity was observed upon addition of $BF_3$-etherate. The reaction was allowed to proceed for 1 hour at 65-85° C. The reaction solution was then poured into MeOH (40 mL), which produced a white precipitate. The white precipitate was collected by filtration, washed with EtOH and dried to afford a white powder 0.65 g (69.4% yield). Infrared spectroscopy confirmed the presence of the maleimido functional group.

While this invention has been described with respect to these specific examples, it should be clear that other modifications and variations would be possible without departing from the spirit of this invention.

What is claimed is:

1. An oligomer consisting of macromolecules of structure I:

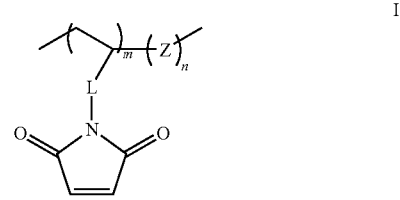

wherein the oligomer is synthesized by cationic copolymerization of monomer A with a cationically polymerizable monomer B, wherein monomer A has the formula:

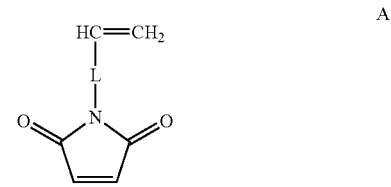

and wherein in structure I, Z is a moiety derived from monomer B selected from the group consisting of propylene, 1-butene, 1-pentene, 1-hexene, a cyclic olefin, a styrene, a vinyl ether, a benzoxazine, and an oxazoline, L is absent or is a moiety selected from the group consisting of an alkylene, an oxyalkylene, an arylene, and a siloxane linker, and each of m and n is an integer independently having the value between 3 and 10,000, with the further proviso that each and every maleimide group that is present in monomer A remains intact in structure I.

2. The oligomer of claim 1, wherein monomer B is a cyclic olefin.

3. The oligomer of claim 2, wherein the cyclic olefin is selected from the group consisting of norbornene, norbornadiene, tetracyclododecene, dicyclopentadiene and other oligomers of cyclopentadiene.

4. The oligomer of claim 3, wherein the cyclic olefin is selected from the group consisting of dicyclopentadiene and other oligomers of cyclopentadiene.

5. The oligomer of claim 1, wherein monomer B is a styrene.

6. The oligomer of claim 5, wherein monomer B is 4-tert-butylstyrene.

7. The oligomer of claim 1, wherein each of m and n has the value between 3 and 5,000.

8. The oligomer of claim 1, wherein each of m and n has the value between 3 and 1,000.

9. The oligomer of claim 1, wherein each of m and n has the value between 3 and 100.

10. The oligomer of claim 1, wherein the oligomer is a block co-oligomer.

11. The oligomer of claim 1, wherein the oligomer is a random co-oligomer.

12. The oligomer of claim 1, wherein the linker L comprises up to 20 carbon atoms.

13. A thermosetting resin composition comprising:
   (a) at least one oligomer of claim 1, and
   (b) between 0.2 and 5 wt % of at least one curing catalyst, based on the total weight of the composition.

14. The thermosetting resin composition of claim 13, further comprising a compound selected from the group consisting of acrylates, methacrylates, maleimides, vinyl ethers, vinyl esters, styrenic compounds and allyl functional compounds.

15. The composition of claim 13, further comprising a reactive diluent.

16. The composition of claim 13, further comprising a filler.

17. The composition of claim 16, wherein the filler is conductive.

18. The composition of claim 17, wherein the filler is thermally conductive.

19. The composition of claim 17, wherein the filler is electrically conductive.

20. The composition of claim 16, wherein the filler is non-conductive.

21. An assembly comprising a first article permanently adhered to a second article by a cured aliquot of the thermosetting resin composition according to claim 13.

22. An article comprising a circuit board having a solder mask deposited thereon, wherein said solder mask is prepared from the composition according to claim 13.

23. An article comprising an electronic component encased within an aliquot of composition according to claim 13.

24. The oligomer of claim 1, wherein monomer B is selected from the group consisting of propylene, 1-butene, 1-pentene, 1-hexene, a cyclic olefin, a vinyl ether, a benzoxazine, and an oxazoline.

25. A thermosetting resin composition comprising:
   (c) at least one oligomer of claim 24, and
   (d) between 0.2 and 5 wt % of at least one curing catalyst, based on the total weight of the composition.

26. The thermosetting resin composition of claim 25, further comprising a compound selected from the group consisting of acrylates, methacrylates, maleimides, vinyl ethers, vinyl esters, styrenic compounds and allyl functional compounds.

27. The composition of claim 25, additionally comprising a component selected from the group consisting of a reactive diluent and a filler.

28. The composition of claim 27, wherein the filler is selected from the group consisting of a conductive filler and a non-conductive filler.

29. An assembly comprising a first article permanently adhered to a second article by a cured aliquot of the thermosetting resin composition according to claim 25.

30. An article comprising a circuit board having a solder mask deposited thereon, wherein said solder mask is prepared from the composition according to claim 25.

31. An article comprising an electronic component encased within an aliquot of composition according to claim 25.

32. A method for preparing an oligomer consisting of macromolecules of structure I:

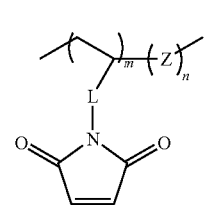

the method comprising:
combining monomer A, a cationically polymerizable monomer B, and a catalyst of cationic polymerization; and
cationically copolymerizing monomer A and monomer B, to thereby obtain the oligomer comprising structure I, wherein monomer A has the formula:

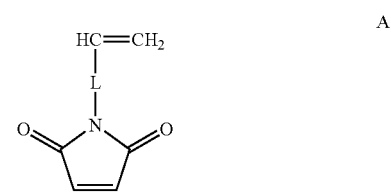

and wherein in structure I, Z is a moiety derived from monomer B selected from the group consisting of propylene, 1-butene, 1-pentene, 1-hexene, a cyclic olefin, a styrene, a vinyl ether, a benzoxazine, and an oxazoline,
L is absent or is a moiety selected from the group consisting of an alkylene, an oxyalkylene, an arylene, and a siloxane linker, and
each of m and n is an integer independently having the value between 3 and 10,000,
with the further proviso that the each and every maleimide group that is present in monomer A remains intact in structure I.

33. The method of claim 32, wherein monomer B is a cyclic olefin.

34. The method of claim 32, wherein the cyclic olefin is selected from the group consisting of norbornene, norbornadiene, tetracyclododecene, dicyclopentadiene and other oligomers of cyclopentadiene.

35. The method of claim 34, wherein the cyclic olefin is selected from the group consisting of dicyclopentadiene and other oligomers of cyclopentadiene.

36. The method of claim 32, wherein monomer B is a styrene.

37. The method of claim 36, wherein monomer B is 4-tert-butylstyrene.

38. The method of claim 32, wherein each of m and n has the value between 3 and 5,000.

39. The method of claim 32, wherein each of m and n has the value between 3 and 1,000.

40. The method of claim 32, wherein each of m and n has the value between 3 and 100.

41. The method of claim 32, wherein the oligomer is a block co-oligomer.

42. The method of claim 32, wherein the oligomer is a random co-oligomer.

43. The method of claim 32, wherein the linker L comprises up to 20 carbon atoms.

* * * * *